United States Patent
Ha

(10) Patent No.: US 8,050,310 B2
(45) Date of Patent: Nov. 1, 2011

(54) SEMICONDUCTOR DEVICE

(75) Inventor: Sung-Joo Ha, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1343 days.

(21) Appl. No.: 11/645,600

(22) Filed: Dec. 27, 2006

(65) Prior Publication Data

US 2007/0280344 A1  Dec. 6, 2007

(30) Foreign Application Priority Data

Jun. 5, 2006  (KR) .................. 10-2006-0050574

(51) Int. Cl.
*H04B 1/00* (2006.01)
*H04B 1/04* (2006.01)
*H04L 27/00* (2006.01)

(52) U.S. Cl. .................. 375/130; 375/326; 455/112

(58) Field of Classification Search ............. 375/130, 375/326; 380/255
See application file for complete search history.

(56) References Cited

U.S. PATENT DOCUMENTS

| | | | | |
|---|---|---|---|---|
| 4,199,817 A | * | 4/1980 | Conkling et al. | 708/445 |
| 5,008,675 A | * | 4/1991 | Toyomaki | 341/152 |
| 5,019,786 A | * | 5/1991 | Fairley et al. | 324/76.77 |
| 6,101,213 A | * | 8/2000 | Van Allen | 375/130 |
| 6,314,145 B1 | * | 11/2001 | van Driest | 375/326 |
| 6,353,574 B1 | | 3/2002 | Shim | |
| 6,449,198 B1 | | 9/2002 | Hamade et al. | |
| 6,535,719 B1 | * | 3/2003 | Suzuki et al. | 455/112 |
| 6,850,444 B2 | | 2/2005 | Cho | |
| 2004/0052374 A1 | * | 3/2004 | Lee et al. | 380/255 |
| 2004/0072552 A1 | * | 4/2004 | Park et al. | 455/334 |

FOREIGN PATENT DOCUMENTS

| | | |
|---|---|---|
| JP | 10-289575 | 10/1998 |
| JP | 2005-310345 A | 11/2005 |
| JP | 2006-114192 A | 4/2006 |
| KR | 10-0161698 | 8/1998 |
| KR | 10-0184493 B1 | 12/1998 |
| KR | 10-2001-0047533 | 5/2001 |

OTHER PUBLICATIONS

Korean Office Action, issued in corresponding Korean Patent Application No. KR 10-2006-0050574, dated on Jun. 20, 2007.

* cited by examiner

*Primary Examiner* — Shuwang Liu
*Assistant Examiner* — Sarah Hassan
(74) *Attorney, Agent, or Firm* — IP & T Group LLP

(57) ABSTRACT

A semiconductor device includes a transmitting unit for receiving plural bits of data to modulate the data to a 1-bit pulse signal whose pulse width corresponds to a value of the data and transferring the pulse signal to a transfer line; and a receiving unit for receiving the pulse signal transferred through the transfer line to demodulate the pulse signal to the plural bits of data.

11 Claims, 3 Drawing Sheets

SEMICONDUCTOR DEVICE

CROSS-REFERENCE TO RELATED APPLICATIONS

The present invention claims priority of Korean patent application number 10-2006-0050574, filed on Jun. 5, 2006, which is incorporated by reference in its entirety.

BACKGROUND OF THE INVENTION

The present invention relates to a semiconductor design technology, and more particularly, to a device for transmitting/receiving data through a global line constituting a single line.

Generally, a dynamic random access memory (DRAM) transfers parallel data through a global line. This method is advantageous for transferring data at a high rate of speed. However, when parallel data are transferred not at high speed but at low speed, since each of the data uses the global line, this method is not efficient.

Therefore, for improving efficiency of the global line, it is possible to convert the parallel data to serial data for transferring data. However, in this case, a pipe latch circuit and a control circuit for controlling the pipe latch circuit should be included at both sides of the global line. Further, when the parallel data are converted to the serial data to be transferred, transfer speed is relatively increased in comparison with transferring the parallel data through a plurality of global lines.

SUMMARY OF THE INVENTION

Embodiments of the present invention are directed to a semiconductor device for converting a plurality of bit data input in parallel to pulse data of a single bit in order to transfer the pulse data through a single global line.

In accordance with an aspect of the present invention, there is provided a semiconductor device, including: a transmitting unit for receiving plural bits of data to modulate the data to a 1-bit pulse signal whose pulse width corresponds to a value of the data and transferring the pulse signal to a transfer line; and a receiving unit for receiving the pulse signal transferred through the transfer line to demodulate the pulse signal to the plural bits of data.

In accordance with another aspect of the present invention, there is provided a semiconductor device, including: a first oscillator for generating a first clock signal; a transmitting counter for counting the first clock signal in response to a control signal; a data comparison unit for comparing plural bits of data with an output signal of the transmitting counter; a pulse generation unit for receiving an output signal of the data comparison unit and the control signal to generate a 1-bit pulse signal; a second oscillator for generating a second clock signal; a receiving counter for counting the second clock signal in response to the pulse signal; and an output unit for outputting a final output signal counted by the receiving counter in response to the pulse signal.

In accordance with a further another aspect of the present invention, there is provided a semiconductor device, including: a transmitting unit for receiving plural bits of data to modulate the data to a 1-bit pulse signal whose pulse width corresponds to a value of the data and transferring the pulse signal to a transfer line; a receiving unit for receiving the pulse signal transferred through the transfer line to demodulate the pulse signal to the plural bits of data; and a transmitting/receiving selection unit for enabling one of the transmitting unit and the receiving unit in response to a selection signal.

DESCRIPTION OF SPECIFIC EMBODIMENTS

It is an object of the present invention to provide a semiconductor device for converting plural bits of data input in parallel to a single bit of pulse data in order to transfer the pulse data through a single global line. Therefore, it is possible to reduce the number of global lines between a data transmitting unit and a data receiving unit.

Hereinafter, a semiconductor device in accordance with the present invention will be described in detail referring to the accompanying drawings.

Figure 1:
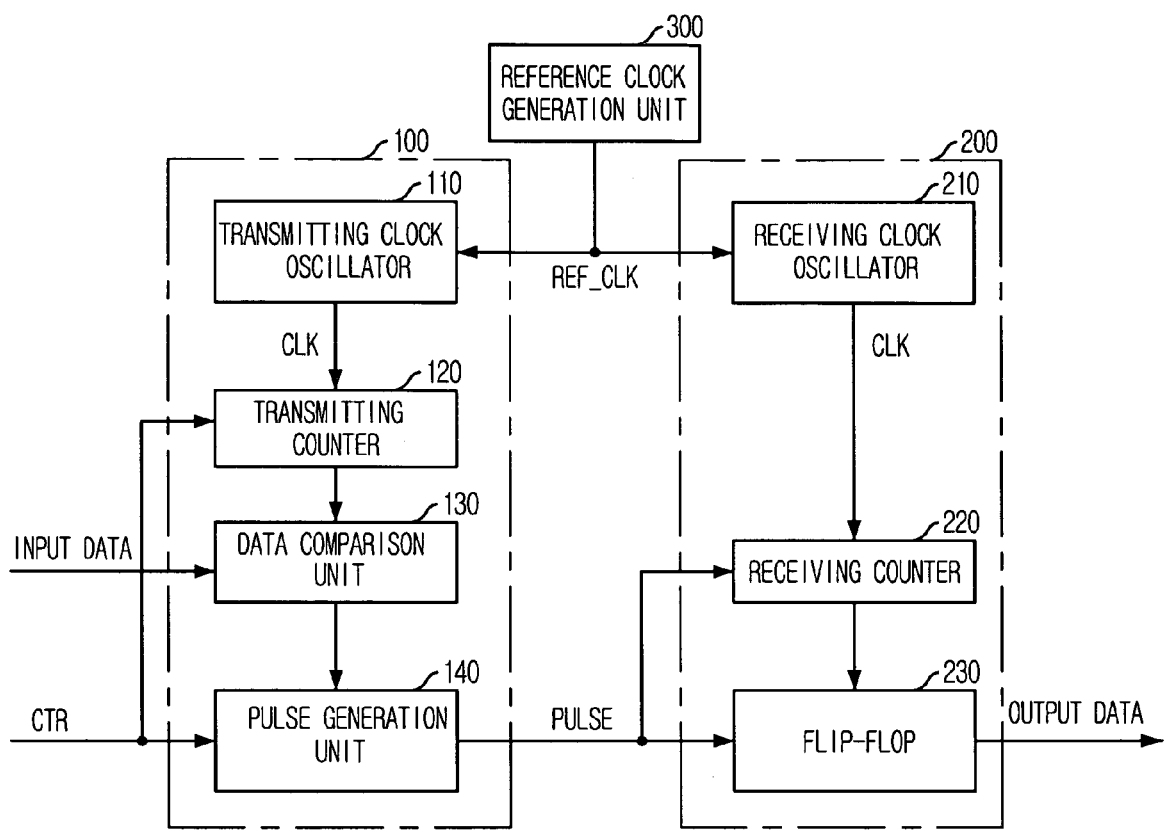
FIG. 1 is a block diagram of a data transfer device for use in a semiconductor device in accordance with a first embodiment of the present invention.

FIG. 1 is a block diagram of a data transfer device for use in a semiconductor device in accordance with a first embodiment of the present invention.

A transmitting unit 100 receives input data INPUT DATA which is 2-bit or more than 2-bit data in order to generate 1-bit pulse data PULSE and transfer the pulse data PULSE through a global line. A receiving unit 200 receives the pulse data PULSE in order to demodulate the 2-bit or more than 2-bit data input to the transmitting unit 100 and output the demodulated data as output data OUTPUT DATA.

A reference clock generation unit 300 can be further included for supplying a reference clock signal REF_CLK to synchronize each clock used in the transmitting unit 100 and the receiving unit 200.

The transmitting unit 100 includes a transmitting clock oscillator 110, a transmitting counter 120, a data comparison unit 130 and a pulse generation unit 140.

The transmitting clock oscillator 110 generates a clock signal CLK in response to the reference clock signal REF_CLK output from the reference clock generation unit 300. The transmitting counter 120 performs a counting operation in response to a control signal CTR. The data comparison unit 130 compares the input data INPUT DATA with a counted value of the transmitting counter 120. The pulse generation unit 140 generates the pulse data PULSE in response to the control signal CTR and an output signal of the data comparison unit 130. The pulse data PULSE is input to the receiving unit 200 through one global line.

The receiving unit 200 includes a receiving clock oscillator 210, a receiving counter 220 and a flip-flop 230.

The receiving clock oscillator 210 generates the clock signal CLK in response to the reference clock signal REF_CLK. The receiving counter 220 receives the clock signal CLK and the pulse data PULSE in order to perform a counting operation. The flip-flop 230 receives the pulse data PULSE and a counted value of the receiving counter 220 to output the output data OUTPUT DATA.

Figure 2:
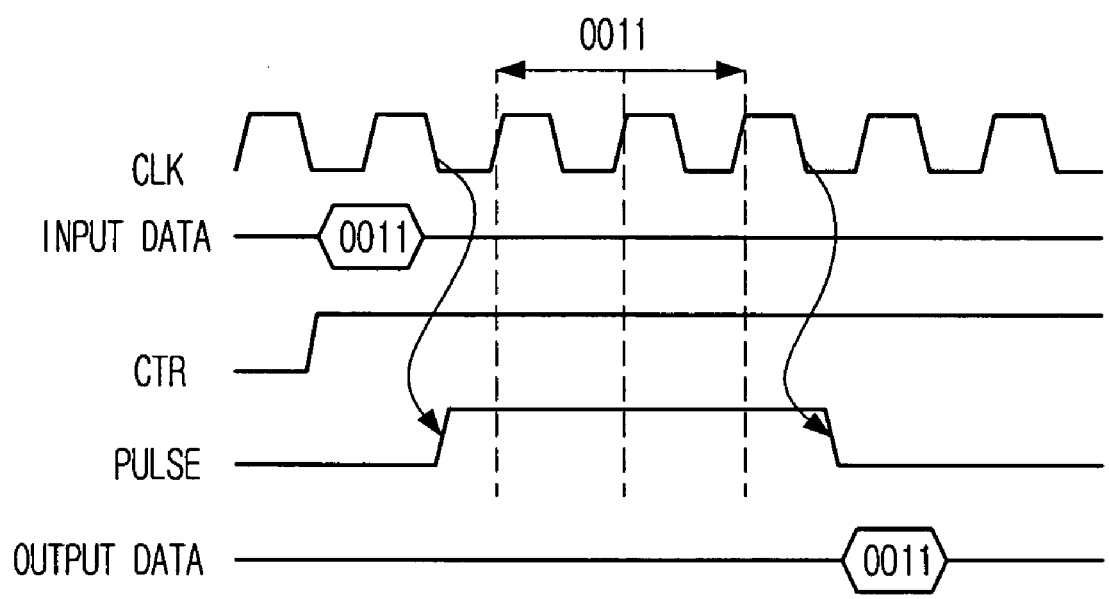
FIG. 2 is a timing diagram for operation of a transmitting unit and a receiving unit shown in FIG. 1.

FIG. 2 is a timing diagram for operation of the transmitting unit 100 and the receiving unit 200 shown in FIG. 1. Herein, it is assumed that the input data INPUT DATA is '0011'.

Referring to FIGS. 1 and 2, each of the transmitting unit 100 and the receiving unit 200 receives the reference clock signal REF_CLK to generate the clock signal CLK, wherein each clock signal CLK has the same frequency. At this time, the input data of '0011' is input and the control signal CTR becomes a logic high level. According to the control signal CTR, the transmitting counter 120 counts rising edges of the clock signal CLK and the pulse data PULSE is changed from a logic low level to a logic high level.

The data comparison unit 130 compares an output signal of the transmitting counter 120 which represents the counted value of the transmitting counter 120 and a value of the input data INPUT DATA. When the counted value of the transmitting counter 120 is '0011', the pulse data PULSE is changed to a logic low level according to an output signal of the data comparison unit 130. Therefore, the pulse data PULSE has a pulse width which corresponds to 3 clocks of the clock signal CLK. That is, the pulse width is determined according to the value of the input data and a period of the clock signal CLK.

The pulse data PULSE is transferred to the receiving unit 200 through a single global line. The receiving counter 220 performs the counting operation while the pulse data PULSE is a logic high level, i.e., during a pulse width of the pulse data PULSE. The flip-flop 230 outputs '0011' which is a final counted value of the receiving unit 220 when the pulse data PULSE becomes a logic low level.

For instance, if the input data INPUT DATA is '0001', the pulse data PULSE has a pulse width of one clock of the clock signal CLK. Likewise, if the input data INPUT DATA is '0100', the pulse data PULSE has a pulse width of 4 clocks of the clock signal CLK.

By including the clock oscillator, the counter, the data comparison unit 130, the pulse generation unit 140, the flip-flop 230 and a transmitting/receiving selection unit (now shown), a bidirectional communication is possible. Herein, the transmitting/receiving selection unit receives a selection signal in order to enable the data comparison unit 130 and the pulse generation unit 140 in case of transmitting or enable the flip-flop 230 in case of receiving. Since this structure is a well-known technology for the bidirectional communication, a detailed description is omitted.

Figure 3:
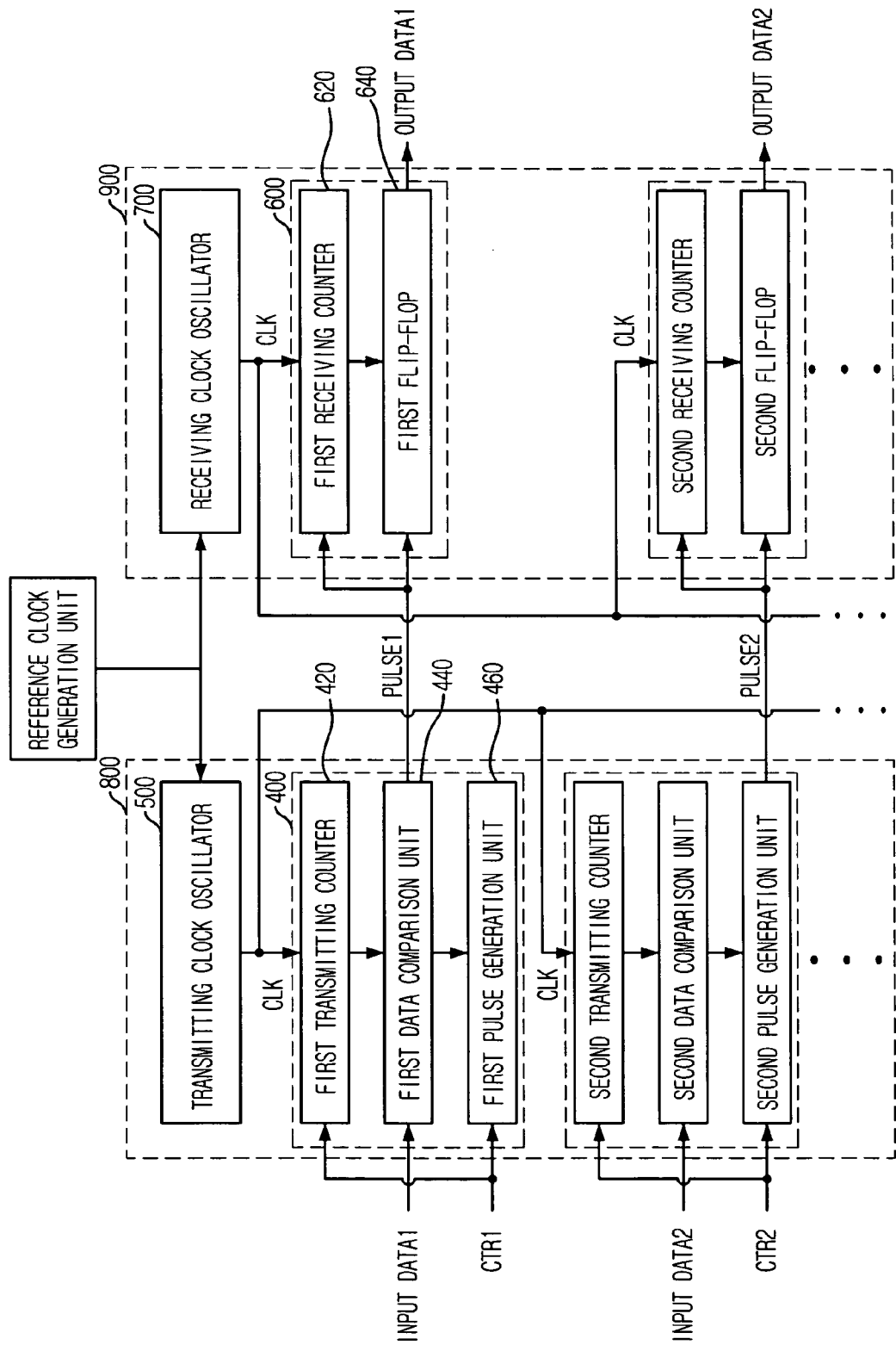
FIG. 3 is a block diagram of a data transfer device in accordance with a second embodiment of the present invention.

FIG. 3 is a block diagram illustrating a data transfer device in accordance with a second embodiment of the present invention.

A transmitting unit 800 includes a plurality of transmitting blocks. Each transmitting block has substantially the same structure, and thus a first transmitting block 400 is explained as an example. The first transmitting block 400 includes a first transmitting counter 420, a first data comparison unit 440 and a first pulse generation unit 460, wherein the plurality of transmitting blocks commonly receive a clock signal CLK generated by a transmitting clock oscillator 500.

A receiving unit 900 includes a plurality of receiving blocks corresponding to the plurality of transmitting blocks. Each receiving block has substantially the same structure, and thus a first receiving block 600 is explained as an example. The first receiving block 600 includes a first receiving counter 620 and a first flip-flop 640. The plurality of receiving blocks commonly receive a clock signal CLK generated by a receiving clock oscillator 700. This structure makes it possible to transmit/receive a greater number of data through fewer global lines.

In accordance with the present invention, the parallel data are converted to one bit pulse signal to be transmitted or received through a single global line. Therefore, it is possible to reduce the number of global lines. Further, since the number to be represented as one bit pulse signal is determined according to capability of a counter, more parallel data can be transmitted or received through the single global line. Furthermore, according to the structure shown in FIG. 3, a number of global lines can be reduced.

The above-mentioned embodiments can be applied to not only a semiconductor device but any device for transferring a plurality of data through a global line.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a transmitting unit for receiving plural bits of data to generate a 1-bit pulse signal whose pulse width corresponds to a value of the data and transferring the pulse signal to a transfer line;
   a receiving unit for receiving the pulse signal transferred through the transfer line to demodulate the pulse signal to the plural bits of data; and
   a reference clock generation unit for generating a reference clock signal, which is used to synchronize a first clock signal of the transmitting unit with a second clock signal of the receiving unit,
   wherein the transmitting unit and the receiving unit operate in synchronization with the reference clock signal; wherein the pulse width is determined in response to the value of the data and a period of the second clock signal.

2. The semiconductor device as recited in claim 1, wherein the transmitting unit includes:
   a transmitting clock oscillator for receiving the reference clock signal to generate the first clock signal;
   a transmitting counter for counting the first clock signal in response to a control signal;
   a data comparison unit for comparing the plural bits of data with an output signal of the transmitting counter; and
   a pulse generation unit for receiving an output signal of the data comparison unit and the control signal to generate the 1-bit pulse signal.

3. The semiconductor device as recited in claim 1, wherein the receiving unit includes:
   a receiving clock oscillator for receiving the reference clock signal to generate the second clock signal;
   a receiving counter for counting the second clock signal in response to the pulse signal; and
   a flip-flop for receiving a counted value of the receiving counter to output the output data in response to the pulse signal.

4. A semiconductor device, comprising:
   a first oscillator for generating a first clock signal;
   a transmitting counter for counting the first clock signal in response to a control signal;
   a data comparison unit for comparing plural bits of data with an output signal of the transmitting counter;
   a pulse generation unit for receiving an output signal of the data comparison unit and the control signal to generate a 1-bit pulse signal;
   a second oscillator for generating a second clock signal;
   a receiving counter for counting the second clock signal in response to the pulse signal;
   an output unit for outputting a final output signal counted by the receiving counter in response to the pulse signal; and
   a reference clock generation unit for synchronizing the first oscillator and the second oscillator.

5. The semiconductor device as recited in claim 4, wherein a pulse width of the pulse signal corresponds to a value of the data.

6. The semiconductor device as recited in claim 5, wherein the pulse width is determined in response to the value of the data and a period of the first clock signal.

7. The semiconductor device as recited in claim 4, wherein the first and the second clock signals have the same frequency.

8. A semiconductor device, comprising:
- a transmitting unit for receiving plural bits of data to generate a 1-bit pulse signal whose pulse width corresponds to a value of the data and transferring the pulse signal to a transfer line;
- a receiving unit for receiving the pulse signal transferred through the transfer line to demodulate the pulse signal to the plural bits of data;
- a transmitting/receiving selection unit for enabling one of the transmitting unit and the receiving unit in response to a selection signal; and
- a reference clock generation unit for generating a reference clock signal, which is used to synchronize a first clock signal of the transmitting unit with a second clock signal of the receiving unit,
- wherein the transmitting unit and the receiving unit operate in synchronization with the reference clock signal; wherein the pulse width is determined in response to the value of the data and a period of the second clock signal.

9. The semiconductor device as recited in claim 8, wherein the transmitting unit includes:
- a transmitting clock oscillator for receiving the reference clock signal to generate the first clock signal;
- a transmitting counter for counting the first clock signal in response to a control signal;
- a data comparison unit for comparing the plural bits of data with an output signal of the transmitting counter; and
- a pulse generation unit for receiving an output signal of the data comparison unit and the control signal to generate the 1-bit pulse signal.

10. The semiconductor device as recited in claim 8, wherein the receiving unit includes:
- a receiving clock oscillator for receiving the reference clock signal to generate the second clock signal;
- a receiving counter for counting the second clock signal in response to the pulse signal; and
- a flip-flop for receiving a counted value of the receiving counter to output the output data in response to the pulse signal.

11. The semiconductor device as recited in claim 10, wherein the transmitting/receiving selection unit enables the data comparison unit and the pulse generation unit in case of transmitting and enables the flip-flop in case of receiving in response to the selection signal.

* * * * *